United States Patent
Kwon

(10) Patent No.: US 7,847,288 B2
(45) Date of Patent: Dec. 7, 2010

(54) METHOD AND RESULTING STRUCTURE FOR FABRICATING TEST KEY STRUCTURES IN DRAM STRUCTURES

(75) Inventor: Young Woo Kwon, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 226 days.

(21) Appl. No.: 12/331,506

(22) Filed: Dec. 10, 2008

(65) Prior Publication Data

US 2009/0101898 A1    Apr. 23, 2009

Related U.S. Application Data

(62) Division of application No. 11/686,588, filed on Mar. 15, 2007, now Pat. No. 7,468,283.

(30) Foreign Application Priority Data

Jan. 19, 2007    (CN) .................. 2007 1 0036770

(51) Int. Cl.
*H01L 29/10*    (2006.01)
(52) U.S. Cl. .................. 257/48; 257/E29.024
(58) Field of Classification Search .......... 257/365, 257/E29.024
See application file for complete search history.

(56) References Cited

U.S. PATENT DOCUMENTS

| | | | | |
|---|---|---|---|---|
| 5,977,558 A | * | 11/1999 | Lee | .................. 257/48 |
| 6,261,883 B1 | * | 7/2001 | Koubuchi et al. | ........... 438/197 |
| 6,806,516 B2 | * | 10/2004 | Negishi et al. | .............. 257/203 |
| 6,881,597 B2 | | 4/2005 | Asayama et al. | |
| 7,468,283 B2 | | 12/2008 | Kwon | |

OTHER PUBLICATIONS

Notice of Allowance for U.S. Appl. No. 11/686,588, mailed on Aug. 21, 2008, 4 pages.
Non-Final Office Action for U.S. Appl. No. 11/686,588, mailed on Mar. 14, 2008, 4 pages.
Requirement for Restriction/Election for U.S. Appl. No. 11/686,588, mailed on Dec. 17, 2007, 5 pages.

* cited by examiner

*Primary Examiner*—Chandra Chaudhari
(74) *Attorney, Agent, or Firm*—Townsend and Townsend and Crew LLP

(57) ABSTRACT

A method for fabricating test structures on a wafer for integrated circuits. The method includes providing a semiconductor substrate, e.g., silicon wafer. The method includes forming a plurality of integrated circuit chip structures on the semiconductor substrate and forming a plurality of MOS devices on a scribe line formed between a first group and a second group of integrated circuit chip structures concurrently using one or more similar processes during forming the plurality of integrated circuit chip structures. The method includes forming a first contact structure and a second contact structure. The first contact structure is coupled to a first MOS device in the plurality of MOS devices and the second contact structure is coupled to an Nth MOS device in the plurality of MOS devices, where N is an integer greater than 1.

10 Claims, 5 Drawing Sheets

- Active Area [N-] — 201
- Metal 1 Area — 205
- Poly Gate Area — 207
- C1 (Plug) + BL Contact — 209, 211
- C1 (Plug) + SN Contact — 213, 215

(TOP VIEW)

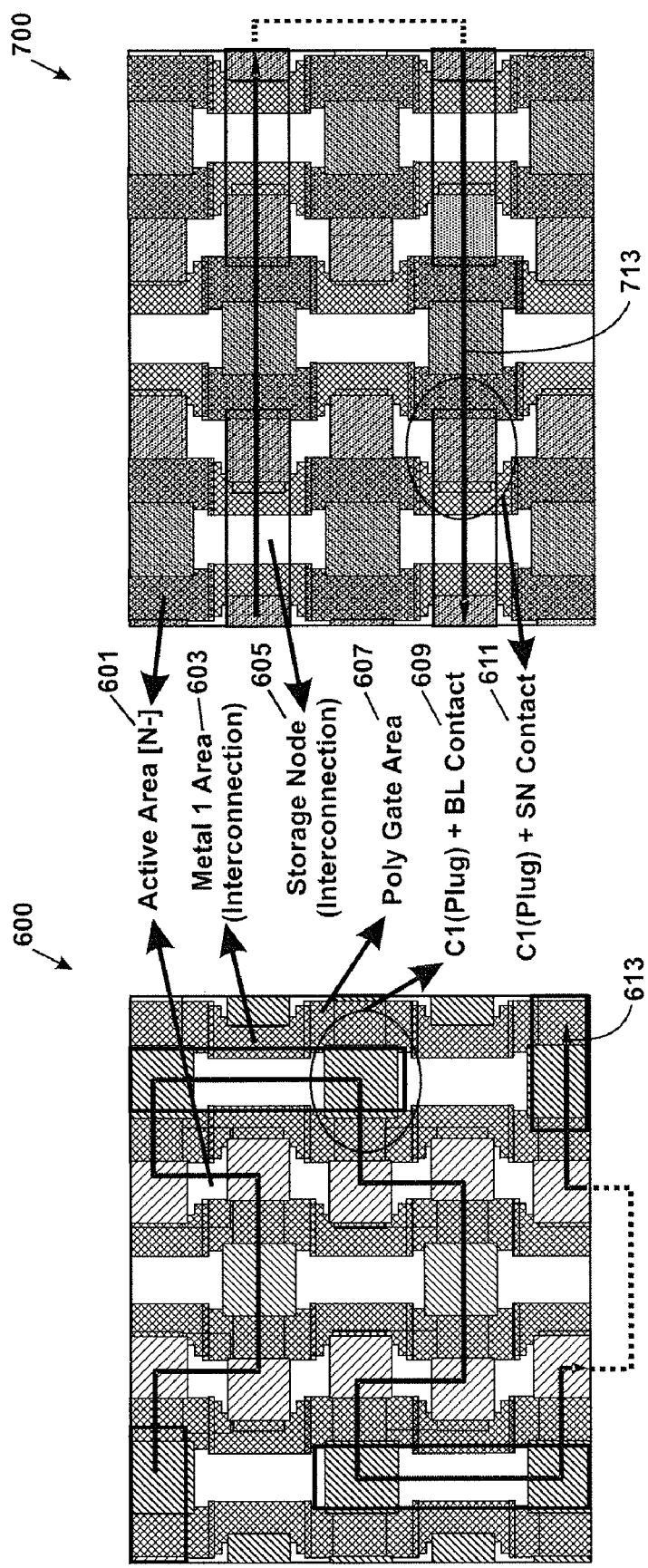

METHOD AND RESULTING STRUCTURE FOR FABRICATING TEST KEY STRUCTURES IN DRAM STRUCTURES

CROSS-REFERENCES TO RELATED APPLICATIONS

This is a divisional of U.S. patent application Ser. No. 11/686,588 filed on Mar. 15, 2007, which application claims priority to Chinese Application No. 200710036770.1; filed on Jan. 19, 2007; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures for manufacturing a test structure for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of test structures for memory devices. Such test structures include, among others, resistance measurement checks. Although there have been significant improvements, such designs still have many limitations. As merely an example, these designs must become smaller and smaller but still provide accurate test results during probe measurements. Additionally, these test designs are often difficult to manufacture and generally require complex manufacturing processes and structures. These and other limitations will be described in further detail throughout the present specification and more particularly below.

From the above, it is seen that an improved technique for processing semiconductor devices is desired.

SUMMARY OF THE INVENTION

According to the present invention, techniques for processing integrated circuits for the manufacture of semiconductor devices are provided. More particularly, the invention provides a method and structures for manufacturing a test structure for dynamic random access memory devices, commonly called DRAMs. But it would be recognized that the invention has a much broader range of applicability.

In a specific embodiment, the present invention provides a semiconductor wafer. The wafer is a semiconductor substrate, e.g., silicon wafer. The substrate includes a plurality of integrated circuit chips formed on the substrate. A scribe line separates at least a first group of chips from a second group of chips. A test pattern is formed on a portion of the scribe line. The test pattern includes an active portion of substrate region. A first contact structure is coupled to a first portion of the active area. The first contact structure includes a first landing plug structure coupled to a first metal line structure. A second contact structure is coupled to a second portion of the active area. The second contact structure includes a second landing plug structure coupled to a second metal line structure. A plurality of MOS devices are formed between the first contact structure and the second contact structure. A first MOS device including a source/drain region and source drain region from the plurality of MOS devices has source/drain region coupled to landing plug structure. An Nth MOS device from the plurality of MOS devices is coupled to the second diffusion, wherein N is an integer greater than 1. The second diffusion is coupled to plug structure. The first contact structure and the second contact structure are adapted to provide a resistance measurement value between the first contact structure and the second contact structure.

In an alternative specific embodiment, the present invention provides a method for fabricating test structures on a wafer for integrated circuits. The method includes providing a semiconductor substrate, e.g., silicon wafer. The method includes forming a plurality of integrated circuit chip structures on the semiconductor substrate and forming a plurality of MOS devices on a scribe line formed between a first group and a second group of integrated circuit chip structures concurrently using one or more similar processes during forming the plurality of integrated circuit chip structures. The method includes forming a first contact structure and a second contact structure. The first contact structure is coupled to a first MOS device in the plurality of MOS devices and the second contact structure is coupled to an Nth MOS device in the plurality of MOS devices, where N is an integer greater than 1. Preferably, the first MOS device is coupled to the Nth MOS device through a chain structure (which a source of one of the devices is coupled to a drain of another device) of MOS devices numbered from 1 through N, where N is the integer greater than 1.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 0.13 microns and less. Additionally, the invention provides test structures that provide improved contact resistance characteristics. That is, the improved contact resistance comes from similar structures that are formed in the active regions of the integrated circuit chips. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 6 through 9 are simplified diagrams illustrating test structures according to embodiments of the present invention.

DETAILED DESCRIPTION OF THE INVENTION

According to the present invention, techniques for processing integrated circuits for the manufacture of semiconductor devices are provided. More particularly, the invention provides a method and structures for manufacturing a test structure for dynamic random access memory devices, commonly called DRAMs. But it would be recognized that the invention has a much broader range of applicability.

Figure 1:
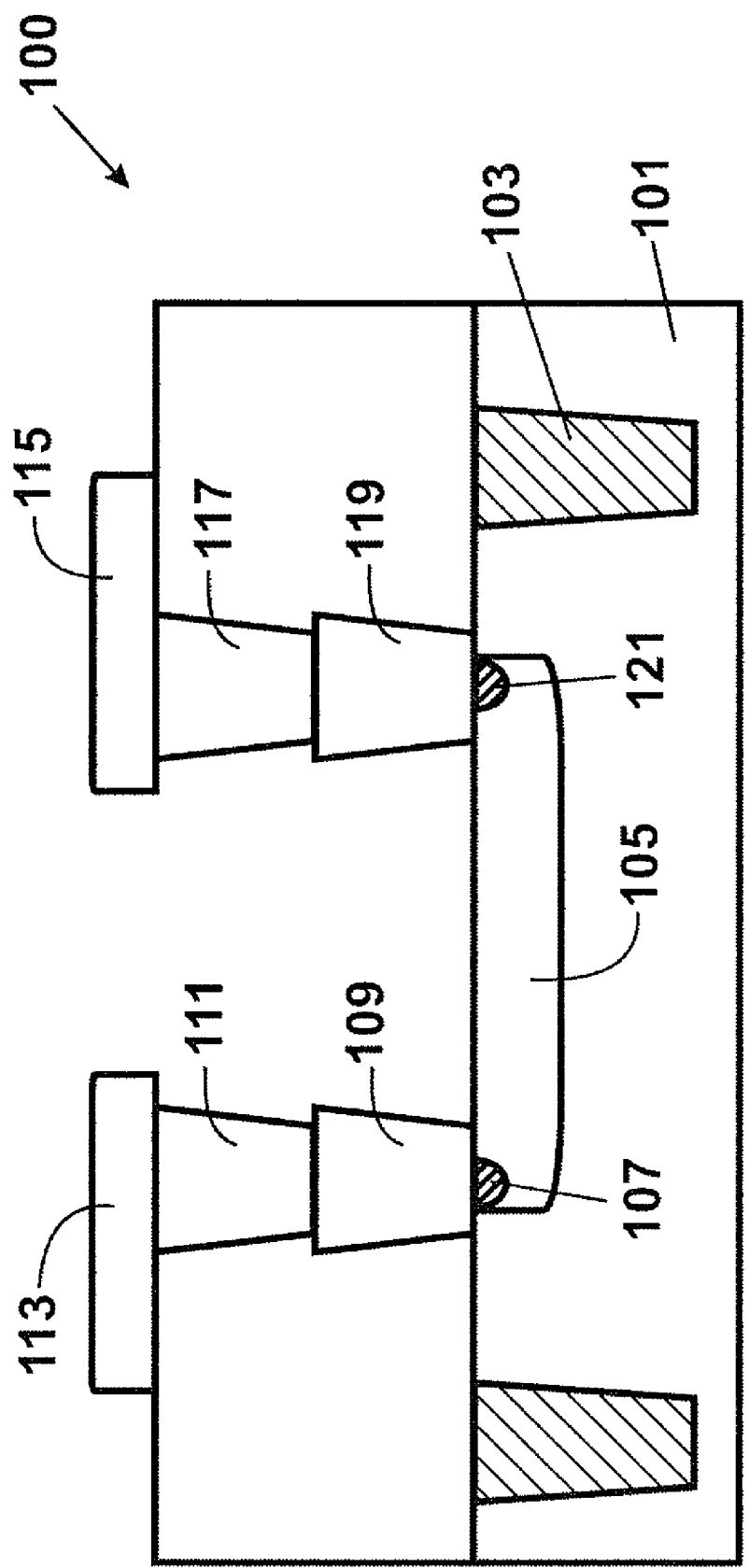
FIG. 1 is a simplified cross-sectional view diagram of a conventional test structure according to an embodiment of the present invention.
Figure 3:
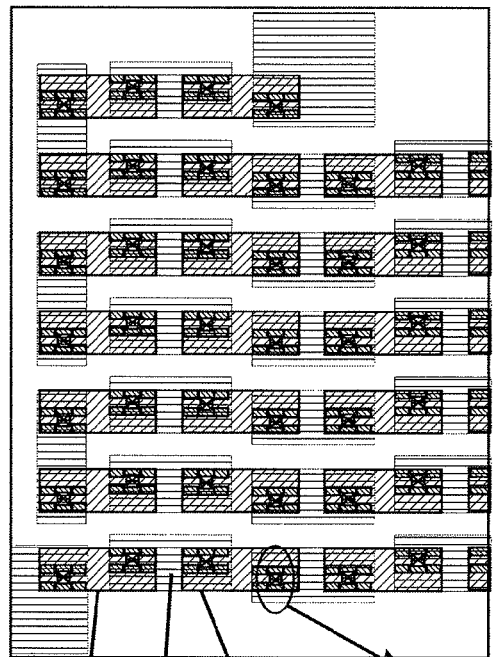
FIGS. 2 through 5 are simplified top-view diagrams of conventional test structures according to embodiments of the present invention.
Figure 2:
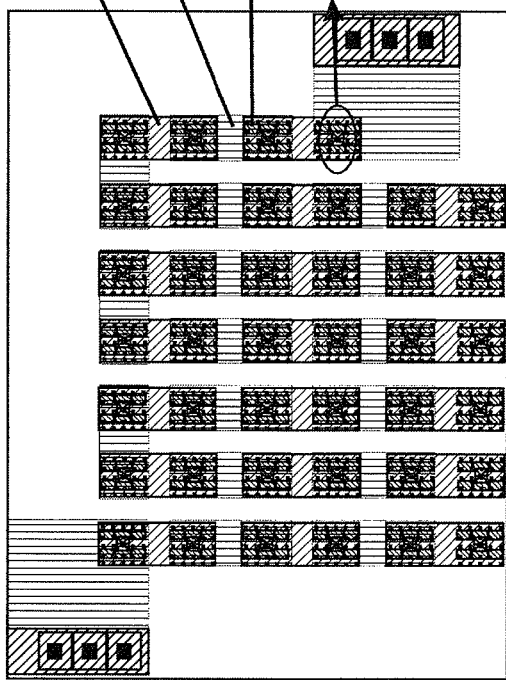

FIG. 1 is a simplified cross-sectional view diagram of a conventional test structure 100 according to an embodiment of the present invention. The conventional test structure includes a first metal layer 113 and a second metal layer 115, which are used to measure resistance between the first metal layer and the second metal layer. The first metal layer 113 is coupled to plug layer 111, which is coupled to plug layer 109. Plug layer 109 is coupled to N-diffusion region 107, which is formed in diffusion region 105. Similarly, metal layer 115 is coupled to plug layer 117, which is coupled to plug layer 119, which is coupled to N-type diffusion region 121. The N-type diffusion regions are within diffusion region 105. The test structure also includes interlayer dielectric region and isolation regions 103, which are formed in semiconductor substrate 101. The resistance values between the two metal layers correspond to the serial resistance $R_{M1}+R_{BLC}+R_{C1}+R_{N-}+R_{C1}+R_{BLC}+R_{M1}$. The test structure is commonly called a chain contact structure, which is used to measure cell resistance values. Unfortunately, many limitations exist with this chain contact structure. That is, this structure does not correspond to certain structures in the actual integrated circuit device. Additionally, as there are many contact regions, the structure is prone to unexpected changes, which make it difficult to provide accurate measurements.

Figure 4:
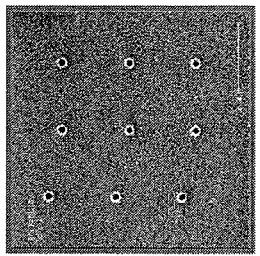
Figure 5:
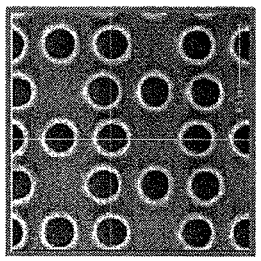

FIGS. 2 through 5 are simplified top-view diagrams of conventional test structures according to embodiments of the present invention. These diagrams are for a bit line measurement structure 200 and a source node measurement structure 300. Each of these structures include an active area 201, metal 1 area 205, polysilicon gate area 207, contact plug area 209 and contact 211 for the bit line, and contact plug 213 and contact 215 for the source node. As shown in FIG. 4, the top view diagram includes a test key, which is "bad" for the bit line measurement structure. Here, the measurement structure indicates a bad chip, while the actual chip is "good" as illustrated by FIG. 5. Additionally, each of the contacts in the conventional test structure is comparatively small and the contacts has a less dense distribution. Accordingly, the measurement structure is ineffective and does not work well. These and other limitations of the conventional techniques are described throughout the present specification. An example of a way of overcoming certain limitations of these conventional techniques are also described throughout the present specification and more particularly below.

A test method according to an embodiment of the present invention may be outlined as follows:
1. Couple a first probe on a first contact structure;
2. Couple a second probe on a second contact structure;
3. Measure a resistance value between the first contact structure and second contact structure, whereupon the resistance value includes $R_{M1}+R_{BLC}+R_{C1}+R_{ch}+R_{N-}+R_{ch}+ \ldots R_{N-n}+R_{chn}+R_{C1}+R_{BLC}+R_{M1}$ (which are defined in more detail below) for a bit line contact structure (N is an integer greater than 1);
4. Perform other steps, as desired.

The above sequence of steps provides a method according to an embodiment of the present invention. As shown, the method uses a combination of steps including a way of measuring a resistance value of a contact structure for a bit line of a dynamic random access memory device. The method can also be applied to other test structures for source node contacts and the like. Of course, other alternatives can also be provided where steps are added, one or more steps are removed, or one or more steps are provided in a different sequence without departing from the scope of the claims herein. Further details of the present method can be found throughout the present specification and more particularly below.

FIGS. 6 through 9 are simplified diagrams illustrating test structures according to embodiments of the present invention. These diagrams are merely examples that should not unduly limit the scope of the claims herein. One of ordinary skill in the art would recognize many variations, modifications, and alternatives. Referring to the top-view diagrams of a bit line resistance measurement structure 600 and a source node resistance measurement structure 700. The bit line resistance measurement structure includes an active area 601, a first metal layer 603, a polysilicon gate area 607, and a contact plug and bit line contact 609. A current flow path for bit line resistance measurement is illustrated by reference numeral 613. As shown, the current path traverses through a plurality of channel regions and contact structures. The source node resistance measurement structure includes an active area 601, a first metal layer 603, a storage node interconnection 605, a polysilicon gate area 607, and contact plug and source node contact 611. A current path for source node resistance measurement is illustrated by reference numeral 713. As shown, each of the current path traverses through a plurality of respectively channel regions and contact structures. Further details of these contact structures are provided throughout the present specification and more particularly below.

Figure 8:
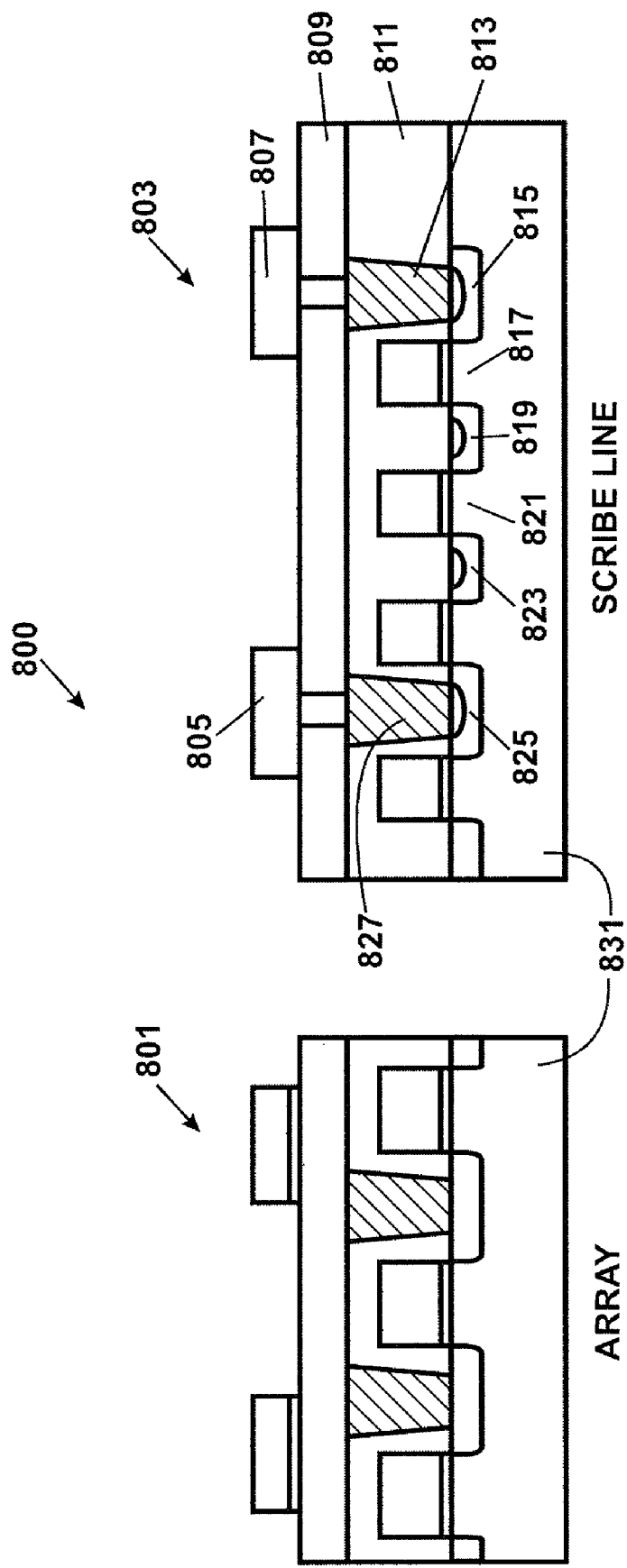
Figure 9:
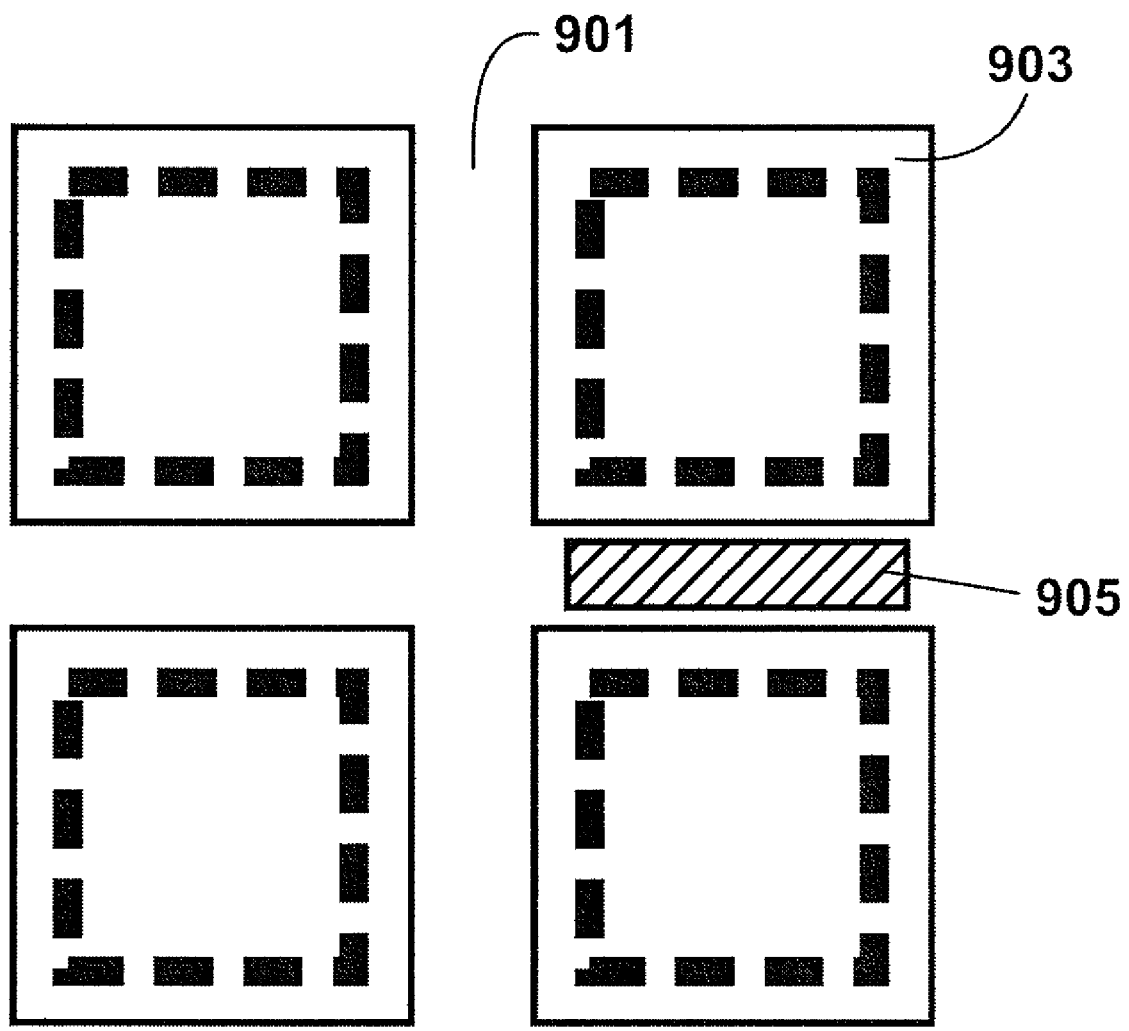

Referring to FIGS. 8 and 9, the test structure according to the present invention includes a substrate 831, e.g., silicon wafer. The substrate includes a plurality of integrated circuit chips 903 formed on the substrate. A scribe line 901 separates at least a first group of chips and a second group of chips. A test pattern 905 is formed on a portion of the scribe line. The test pattern includes an active portion of substrate region. A first contact structure is coupled to a first portion of the active area. The first contact structure includes a first landing plug structure 827 coupled to a first metal line structure 805.

A second contact structure is coupled to a second portion of the active area. The second contact structure includes a second landing plug structure 813 coupled to a second metal line structure 807. A plurality of MOS devices are formed between the first contact structure and the second contact structure. A first MOS device including a source/drain region 825 and source drain region 823 from the plurality of MOS devices has source/drain region 825 coupled to landing plug structure 827. An Nth MOS device from the plurality of MOS devices is coupled to the second diffusion 815, wherein N is an integer greater than 1. The second diffusion is coupled to plug structure 813. The first contact structure and the second contact structure are adapted to provide a resistance measurement value between the first contact structure and the second contact structure. As shown, the resistance path also may include diffusion regions 823, 819. The resistance path also includes channel regions 821 and others. Preferably, the test pattern is a same pattern as in one of the integrated circuit chips in the array area 801.

In a specific embodiment, the device also includes various contact structures. The first contact structure is coupled to a first probe pad. The second contact structure is coupled to a second probe pad. Preferably, the test pattern is among a plurality of test patterns on the scribe line. Such test patterns may be used for other purposes. Additionally, the test pattern is for memory devices, e.g., dynamic random access memory chips. Preferably, the device include a plurality of MOS devices is characterized by a design rule of 0.13 microns and less. Of course, there can be other variations, modifications, and alternatives.

Referring to FIG. 8 again, embodiments of the present invention also include a method for fabricating test structures on a wafer for integrated circuits. The method includes providing a semiconductor substrate 831, e.g., silicon wafer. The method includes forming a plurality of integrated circuit chip structures on the semiconductor substrate and forming a plurality of MOS devices on a scribe line formed between a first group and a second group of integrated circuit chip structures concurrently using one or more similar processes during forming the plurality of integrated circuit chip structures. The method includes forming a first contact structure and a second contact structure within a first interlayer dielectric layer 809 and second interlayer dielectric layer 811. The first contact structure is coupled to a first MOS device in the plurality of MOS devices and the second contact structure is coupled to an Nth MOS device in the plurality of MOS devices, where N is an integer greater than 1. By forming the test structures concurrently and using the same process as the array, the present invention is more efficient and achieves improved results. That is, the test structures provide similar or the same resistance values as the array structures, which provides better test measurements.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor wafer comprising:
   a substrate;
   a plurality of integrated circuit chips formed on the substrate;
   a scribe line separating at least a first group of chips and a second group of chips;
   a test pattern formed on a portion of the scribe line, the test pattern comprising:
      an active portion of substrate region;
      a first contact structure coupled to a first portion of the active area, the first contact structure including a first landing plug structure coupled to a first metal line structure;
      a second contact structure coupled to a second portion of the active area, the second contact structure including a second landing plug structure coupled to a second metal line structure, and the second contact structure being adjacent to the first contact structure;
      at least two or more of MOS devices formed between the first contact structure and the second contact structure;
      a first MOS device from the at least two or more of MOS devices is coupled to the first diffusion; and
      an Nth MOS device from the at least two or more of MOS devices is coupled to the second diffusion, wherein N is an integer greater than 1;
      whereupon the first contact structure and the second contact structure are adapted to provide a resistance measurement value between the first contact structure and the second contact structure.

2. The device of claim 1 wherein the test pattern is a same pattern as in one of the integrated circuit chips.

3. The device of claim 1 wherein the first contact structure is coupled to a first probe pad.

4. The device of claim 1 wherein the second contact structure is coupled to a second probe pad.

5. The device of claim 1 wherein the test pattern is among a plurality of test patterns on the scribe line.

6. The device of claim 1 wherein the integrated circuit chips are memory devices.

7. The device of claim 1 wherein the integrated circuit chips comprise dynamic random access memory chips.

8. The device of claim 1 wherein the at least two or more of MOS devices are characterized by a design rule of 0.13 microns and less.

9. The device of claim 1 wherein the test structure provides a resistance measurement between the first contact structure and the second contact structure characterized similar resistance values as the array structures.

10. The device of claim 1 wherein the first portion of active area comprises a first diffusion and a second portion of the active area comprises a second diffusion.

* * * * *